Dec. 3, 1968 J. V. FISHER 3,414,405

ALLOYS FOR MAKING THERMOELECTRIC DEVICES

Filed Aug. 16, 1965 2 Sheets-Sheet 1

INVENTOR.
JOSEPH V. FISHER

BY

ATTORNEY

INVENTOR
JOSEPH V. FISHER
BY [signature]
ATTORNEY

United States Patent Office 3,414,405
Patented Dec. 3, 1968

3,414,405
ALLOYS FOR MAKING THERMOELECTRIC DEVICES

Joseph V. Fisher, Valencia, Pa., assignor to Semi-Elements, Inc., Saxonburg, Pa.
Filed Aug. 16, 1965, Ser. No. 480,027
10 Claims. (Cl. 75—134)

ABSTRACT OF THE DISCLOSURE

This patent discloses certain binary alloys of bismuth with effective amounts of dopant element of the group S, Se, Te, Pb, Tl, Hg, Au and As. When grown as single crystals made from material of at least 99.9% purity, and containing the herein-taught amounts of dopant element, the alloys exhibit high thermoelectric figures of merit, such as about 5 or 6 using the Peltier effect alone.

Figure 1:
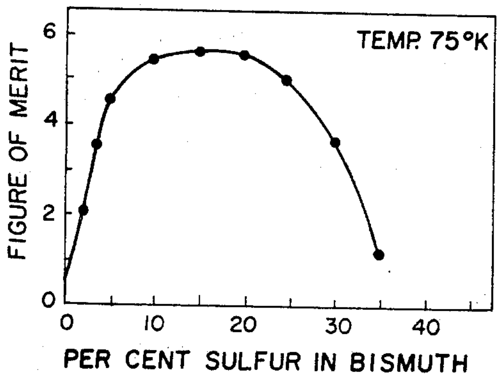

This invention relates to the manufacture of semimetal alloys, and more particularly to semimetal alloys in single crystal form which are extremely useful as thermoelectric refrigerating devices and as magneto-thermoelectric refrigerating devices.

As is known, thermoelectric refrigerating devices use the Peltier effect to produce a temperature drop across the device. That is, when a current is caused to flow through certain semiconductor or semimetal materials, there results a warming of one end of the device and a cooling of the other end of the device. The temperature drop occurs along the path of the electric current. To enhance the Peltier effect, that is, cause a further temperature drop to be produced, a magnetic field may be impressed across the device in a direction which is perpendicular to the path of the electric current.

As is also known, a temperature drop is produced in a magneto-thermoelectric refrigerating device by the Ettingshausen effect. The Ettingshausen effect requires a magnetic field which is impressed perpendicularly across the path of the electric current. In this instance, the temperature drop across the device occurs in a direction which is perpendicular to both the electric current flow and the magnetic field.

A measure of the amount of cooling which can be achieved in either a thermoelectric or a magneto-thermoelectric refrigerating device, is known as the "figure of merit." The figure of merit is a numerical combination of those properties which make a material useful for thermoelectric or magneto-thermoelectric refrigerating applications. To be more precise, the figure of merit Z is determined by the equation $$Z=S^2/\rho K$$

where S is the Seebeck coefficient in microvolts per degree Kelvin, relating to the thermal electromotive force of a thermoelectric material with respect to copper or lead, $\rho$ is the electrical resistivity in ohm-cm. and K is the thermal conductivity in watts/cm. degree. Z has units of deg.$^{-1}$, and as its values with certain materials known and tested prior to this invention have been in the range 0.001 to 0.004, it has been customary to report figures of merit $Z \cdot 10^3$/deg., to obtain figures of merit ranging from about 1 to 4. As reported in the literature, magnetic enhancement of the thermoelectric cooling devices increases the figure of merit by substantial amounts. Similarly, magneto-thermoelectric cooling devices have figures of merit which are higher than conventional thermoelectric cooling devices.

An object of the invention is to provide novel semimetal alloy compositions for thermoelectric and magneto-thermoelectric refrigerating devices.

Another object of the invention is to provide single crystals having novel semimetal alloy compositions and which can be used as thermoelectric refrigerating devices and as magneto-thermoelectric refrigerating devices.

Still another object of the invention is to provide thermoelectric and magneto-thermoelectric cooling devices formed from novel semimetal alloy compositions of the invention and whose figure of merit is at least equal to the figures of merit reported for certain semiconductor and semimetal materials.

The above and other objects and advantages of the invention will become apparent from the following examples with reference to the accompanying drawings, in which:

FIGURES 1–8 are plotted curves of the figure of merit of semimetal alloy compositions of the invention, as a function of the amount of dopant present in the host metal.

The present invention resides in the discovery that bismuth can be doped with an element or dopant selected from the group consisting of sulfur, selenium, tellurium, lead, thallium, mercury, gold and arsenic, within certain weight ranges, to produce single crystals which are extremely useful as thermoelectric refrigerating devices. Specifically, I have found that bismuth can be doped with about 0.005 to 40% by weight of the aforesaid dopants to produce single crystals of a semimetal alloy, which are operative as thermoelectric refrigerators having improved cooling efficiencies as evidenced by the figures of merit of the examples to follow. The preferred weight ranges of the dopant, that is, the range of weights which produce figures of merit comparable to or greater than the prior art refrigeration elements, is largely dependent on the individual dopant, the preferred ranges will be specified later in the specification in connection with the specific examples to be given.

The present invention also resides in the discovery that bismuth can be doped with an element or dopant selected from the group consisting of sulfur, selenium, tellurium, lead, thallium, mercury, gold and arsenic, within certain weight ranges, to produce single crystals of a semimetal alloy, which single crystal can be operated as a cooling device using either the Peltier effect (thermoelectric refrigerator) or the Ettingshausen effect (magneto-thermoelectric refrigerator).

In the semimetal alloys of the present invention, the element bismuth is the host metal and must have, initially, a purity of 99.9%. The above listed elements, that is, sulfur, selenium, tellurium, lead, thallium, mercury, gold and arsenic, are considered as the dopant and are present, for example, in an amount from about 0.005 to 40% by weight of the single crystal. As in the case of the host metal, the dopant must have, initially, a purity of 99.9%. If the purities of the host metal and the dopant are not at least 99.9%, the figure of merit of the resulting single crystal cannot be predicted.

As stated above, the present semimetal alloy compositions comprise bismuth as the host metal and a dopant selected from the group consisting of sulfur, selenium, tellurium, lead, thallium, mercury, gold and arsenic. For each of the aforesaid dopants, a series of single-crystal semimetal alloy samples were prepared comprising bismuth doped with various amounts of the particular one of the aforesaid dopants being tested. The figure of merit of each sample was calculated from three measured properties of each sample, that is, the thermoelectric effect, the electrical resistance and the thermal conductivity. A complete explanation of the means for measuring these properties and the calculations required to obtain the figure of merit is not believed to be necessary inasmuch as these measurements and calculations are well known in the art.

The results of these tests are graphically illustrated in FIGS. 1–8 which are plotted curves of the figure of merit of various semimetal alloys of the invention as a function of the percent of dopant in the host material. The figures of merit achieved by these alloys are applicable to an environmental temperature of 75° K.

Example I

FIG. 1 represents the effect of varying the amount of sulfur in a bismuth-sulfur alloy. A maximum figure of merit of 5.6 was obtained at 15% by weight of sulfur. The preferred weight range of sulfur is from about 3 to 29% by weight inasmuch as the figure of merit drops off sharply below 3% by weight and above 29% by weight. Between 10 to 20% by weight of sulfur, the figure of merit is relatively constant.

Example II

Figure 2:
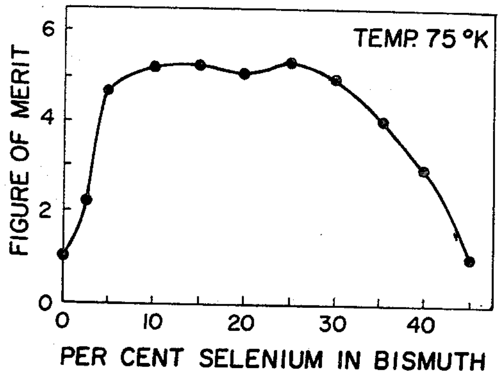

FIG. 2 represents bismuth-selenium alloys which show a relatively larger weight range wherein the figure of merit is relatively constant. That is to say, the bismuth-selenium alloys appear to operate more uniformly over a wider range of selenium additions than do the bismuth-sulfur alloys, for example. The preferred weight range for selenium is from about 4 to 35% by weight of selenium. The dip at 20% by weight selenium is probably due to a trace impurity.

Example III

Figure 3:
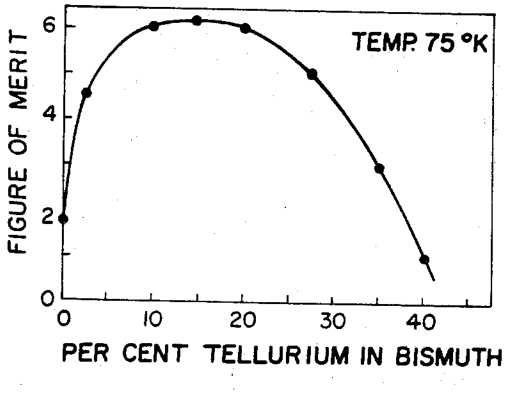

FIG. 3 represents bismuth-tellurium alloys whose performance is very similar to the bismuth-sulfur alloys in that the curves are similarly shaped. However, it is to be noted that the preferred weight range for tellurium is from about 2.5 to 32% by weight. The bismuth-tellurium alloys perform better than the bismuth-sulfur alloys in that the figure of merit of these alloys ranges from 12 to 30% higher than the figure of merit of corresponding amounts of sulfur.

Example IV

Figure 4:
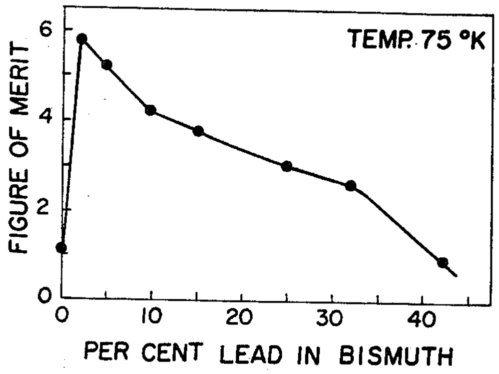

FIG. 4 represents bismuth-lead alloys. The lead content of these alloys is critical inasmuch as a maximum figure of merit of 5.8 is reached at a lead content of only about 3% by weight. Thereafter, the figure of merit falls off rapidly. The preferred weight range for lead is from about 2 to 13% by weight.

Example V

Figure 5:
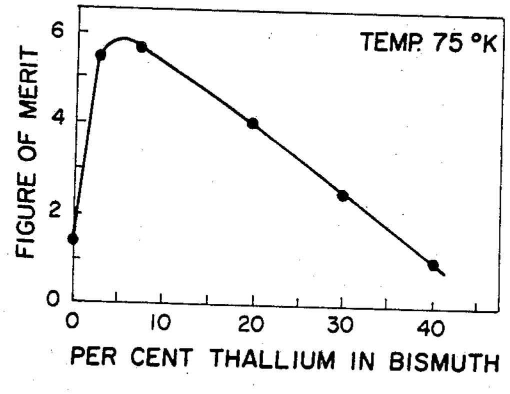

FIG. 5 represents bismuth-thallium alloys whose performance is similar to the bismuth-lead alloys. However, the bismuth-thallium alloys do not peak as rapidly as the bismuth-lead alloys. A maximum figure of merit of 5.9 was achieved at 5% by weight of thallium. The preferred weight range for thallium is from about 1.5 to 20% by weight.

Example VI

Figure 6:
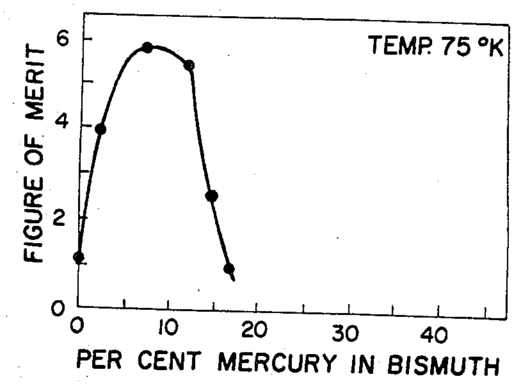

FIG. 6 represents bismuth-mercury alloys which have a relatively narrow operating range. That is to say, the figure of merit rises to a maximum value of 5.9 at about 8% mercury and falls to a value of about 1 over the relatively narrow weight range of between about 0.005 to 17% by weight of mercury. The preferred weight range for mercury is from about 2.5 to 14% by weight of mercury.

Example VII

Figure 7:
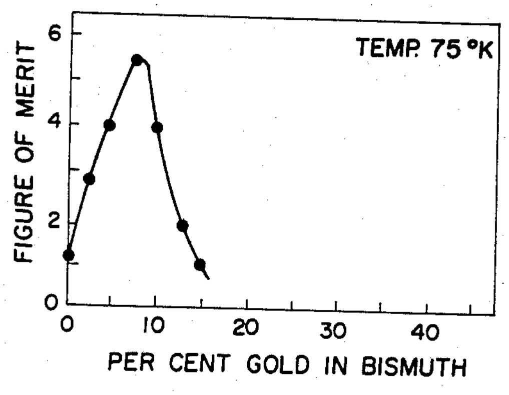

FIG. 7 represents bismuth-gold alloys whose performance is similar to that of the bismuth-mercury alloys. Again, the figure of merit rises sharply from a value of about 1 to a maximum value of 5.5 at about 7.5% of gold and then falls sharply to a value of 1 over the relatively narrow weight range of about 0.005 to 15% by weight of gold. The preferred weight range for gold is from 4 to 10% by weight.

Example VIII

Figure 8:
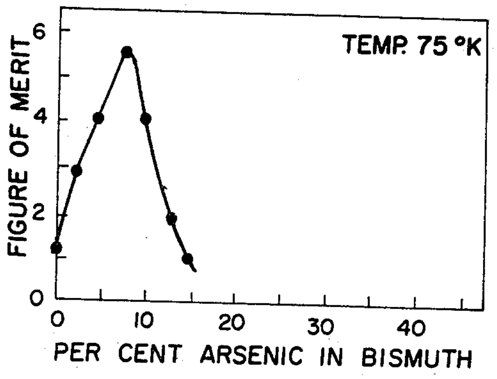

FIG. 8 represents bismuth-arsenic alloys which have a wider weight range than that of the bismuth-mercury and the bismuth-gold alloys. A maximum figure of merit of 6.1 was achieved at about 19% by weight of arsenic. The preferred weight range for arsenic is from about 7 to 29% by weight.

All of the curves illustrated in FIGS. 1–8 represent the thermoelectric figure of merit, that is, the elements were operated using the Peltier effect. Impressing a magnetic field across these samples will, of course, shift the curve by approximately two units of the figure of merit. Furthermore, each of the alloys represented in FIGS. 1–8, is also operable as a magneto-thermoelectric refrigerating device. That is to say, each of these alloys may be operated as a cooling device using the Ettingshausen effect to obtain a temperature drop thereacross. Of course, when used as magneto-thermoelectric refrigerating devices, the resulting figure of merit will be increased, over that shown in FIGS. 1–8, by approximately two to two and one-half units of the figure of merit.

Although the invention has been shown in connection with certain specific examples, it will be readily apparent to those skilled in the art that various changes in compositions may be made to suit requirements without departing from the spirit and scope of the invention.

I claim as my invention:

1. A binary alloy of bismuth and an effective amount ranging from 0.005 to 40% by weight of a dopant element selected from the group consisting of sulfur, selenium, tellurium, lead, thallium, mercury, gold and arsenic, said alloy being made from material at least 99.9% pure and being in the form of a single crystal having a thermoelectric figure of merit, at 75° K. using only the Peltier effect, of at least 5.

2. An alloy as defined in claim 1, characterized in that said dopant element is sulfur and is present in an amount of between 10% and 20% by weight.

3. An alloy as defined in claim 1, characterized in that said dopant element is selenium and is present in an amount of between 10% and 30% by weight.

4. An alloy as defined in claim 1, characterized in that said dopant element is tellurium and is present in an amount of between 5% and 30% by weight.

5. An alloy as defined in claim 4, characterized in that said figure of merit is at least 6 and said tellurium is present in an amount of 10% to 20% by weight.

6. An alloy as defined in claim 1, characterized in that said dopant element is lead and is present in an amount of between 2% and 13% by weight.

7. An alloy as defined in claim 1, characterized in that said dopant element is thallium and is present in an amount of between 2% and 13% by weight.

8. An alloy as defined in claim 1, characterized in that said dopant element is mercury and is present in an amount of between 4% and 12% by weight.

9. An alloy as defined in claim 1, characterized in that said dopant element is gold and is present in an amount of between 8% and 10% by weight.

10. An alloy as defined in claim 1, characterized in that said dopant element is arsenic and is present in an amount of between 7% and 10% by weight.

References Cited

UNITED STATES PATENTS

| | | | |
|---|---|---|---|
| 2,762,857 | 9/1956 | Lindenblad | 75—134 |
| 2,893,831 | 7/1959 | Bither | 136—240 |
| 3,055,962 | 9/1962 | Conn | 136—240 |
| 3,303,427 | 2/1967 | Esaki | 148—1.6 |
| 3,310,493 | 3/1967 | Rupprecht | 136—240 |

RICHARD O. DEAN, *Primary Examiner.*